United States Patent
Ozaki et al.

(10) Patent No.: US 8,859,446 B2
(45) Date of Patent: Oct. 14, 2014

(54) α ALUMINA SINTERED BODY FOR PRODUCTION OF SAPPHIRE SINGLE CRYSTAL

(75) Inventors: Hirotaka Ozaki, Niihama (JP); Shinji Fujiwara, Niihama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 233 days.

(21) Appl. No.: 13/341,154

(22) Filed: Dec. 30, 2011

(65) Prior Publication Data
US 2012/0171450 A1    Jul. 5, 2012

(30) Foreign Application Priority Data
Jan. 4, 2011    (JP) ............................... P 2011-000128

(51) Int. Cl.
| | |
|---|---|
| C04B 35/00 | (2006.01) |
| C04B 35/111 | (2006.01) |
| C30B 1/12 | (2006.01) |
| C30B 29/20 | (2006.01) |
| C04B 35/64 | (2006.01) |
| C01F 7/02 | (2006.01) |

(52) U.S. Cl.
CPC ................. *C04B 35/111* (2013.01); *C30B 1/12* (2013.01); *C04B 2235/5409* (2013.01); *C04B 2235/5472* (2013.01); *C01P 2006/80* (2013.01); *C01P 2004/61* (2013.01); *C04B 2235/3217* (2013.01); *C01P 2006/11* (2013.01); *C04B 2235/77* (2013.01); *C30B 29/20* (2013.01); *C01P 2006/82* (2013.01); *C04B 2235/6567* (2013.01); *C01P 2004/62* (2013.01); *C04B 2235/604* (2013.01); *C04B 35/64* (2013.01); *C01F 7/02* (2013.01); *C04B 2235/728* (2013.01); *C01P 2006/12* (2013.01); *C04B 2235/94* (2013.01); *C04B 2235/6562* (2013.01); *C04B 2235/725* (2013.01); *C04B 2235/322* (2013.01); *C04B 2235/441* (2013.01)
USPC ........................................... 501/127; 501/153

(58) Field of Classification Search
CPC .. C04B 35/111; C04B 35/115; C04B 35/117; C04B 35/652
USPC ................................................ 501/127, 153
See application file for complete search history.

(56) References Cited

U.S. PATENT DOCUMENTS

| | | | |
|---|---|---|---|
| 7,625,546 B2 * | 12/2009 | Delespierre et al. | 423/600 |
| 2010/0040535 A1 | 2/2010 | Azima et al. | |

FOREIGN PATENT DOCUMENTS

| | | |
|---|---|---|
| CN | 101659437 A | 3/2010 |
| CN | 101759216 A | 6/2010 |

(Continued)

OTHER PUBLICATIONS

Chen et al. Extrusion of α-Al2O3-Boehmite Mixtures. J Am Ceram Soc, 75 [3]. 575-579 (1992).*
Kumar et al.Monohydroxy Aluminum Oxide (Boehmite, AlOOH) as a Reactive Binder for Extrusion of Alumina Ceramics. Journal of the European Ceramic Society. 17 (1997) 1167-1172.*

(Continued)

*Primary Examiner* — Noah Wiese
(74) *Attorney, Agent, or Firm* — Sughrue Mion, PLLC

(57) ABSTRACT

A method for producing an α alumina sintered body for the production of a sapphire single crystal characterized in that a relative density is 60% or more, a closed porosity is 10% or less, a purity is 99.99% by mass or more, each content of Si, Na, Ca, Fe, Cu and Mg is 10 ppm or less, and a volume is 1 cm$^3$ or more, and the α alumina sintered body can be obtained by mixing 100 parts by weight of an α alumina with 1 part by weight or more and 20 parts by weight or less of an α alumina precursor to obtain a mixture, forming a compact from the obtained mixture, and firing the obtained compact.

12 Claims, 1 Drawing Sheet

(56) References Cited

FOREIGN PATENT DOCUMENTS

| CN | 101913636 | A | 12/2010 |
|---|---|---|---|
| JP | 05-097569 | A | 4/1993 |
| JP | 2007-145611 | | 6/2007 |
| JP | 2008-100903 | A | 5/2008 |

OTHER PUBLICATIONS

Chinese Office Action issued on Mar. 3, 2014 in Chinese Patent Application 201110446639.9.
Office Action dated May 27, 2014 in corresponding Japanese Patent Application 2011-000128.

* cited by examiner

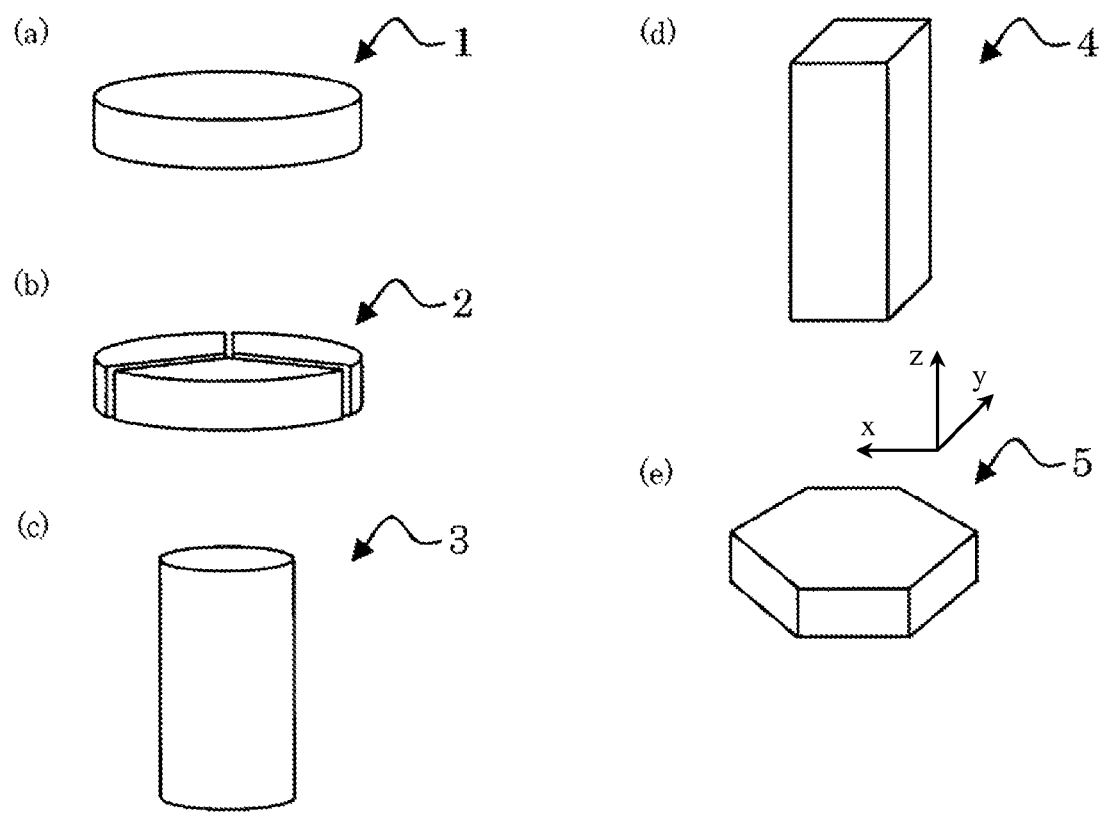

ALUMINA SINTERED BODY FOR PRODUCTION OF SAPPHIRE SINGLE CRYSTAL

BACKGROUND OF THE INVENTION

1. Field of the Invention

The present invention relates to an α alumina sintered body (alpha alumina sintered body) for the production of a sapphire single crystal.

2. Description of the Related Art

An α alumina powder is useful as a raw material for the production of a sapphire single crystal. The sapphire single crystal can be produced, for example, by a method in which an α alumina powder is filled in a crucible made of metallic molybdenum, heating to melt the α alumina powder, and pulling up the melt from the melted alumina [JP H5-97569A]

JP H5-97569A is incorporated by reference herein.

However, a conventional α alumina powder was not sufficient in production efficiency of a sapphire single crystal.

SUMMARY OF THE INVENTION

Therefore, an object of the present invention is to provide an α alumina sintered body (or an alpha alumina sintered body) for the production of a sapphire single crystal, which can produce sapphire single crystal with high production efficiency, and a method for producing the same.

The present inventors have examined so as to develop an α alumina raw material suited for the production of a sapphire single crystal, and thus the present invention has been completed.

That is, the present invention includes the following constitutions:

(1) An α alumina sintered body for the production of a sapphire single crystal, wherein a relative density thereof is 60% or more, a closed porosity thereof is 10% or less, a purity thereof is 99.99% by mass or more, each content of Si, Na, Ca, Fe, Cu and Mg therein is 10 ppm or less, and a volume thereof is 1 cm$^3$ or more.

(2) The α alumina sintered body according to the above (1), wherein a shape thereof is a disk, a column, a prism, and a multiangular plate.

(3) The α alumina sintered body according to said (2), which is any one of (i) to (iv).

(i) a shape thereof is a disk, a diameter of a cross section thereof is 5 mm or more and 500 mm or less, a thickness thereof is 5 mm or more and less than 500 mm, and a thickness thereof is 0.01 or more and less than 1 when the diameter is assumed to be 1;

(ii) a shape thereof is a column, a diameter of a cross section thereof is 5 mm or more and 500 mm or less, a height thereof is 5 mm or more and 2,000 mm or less, and a height thereof is 1 or more and 100 or less when the diameter is assumed to be 1;

(iii) a shape thereof is a prism, an equivalent circle diameter of a cross section thereof is 5 mm or more and 500 mm or less, a height thereof is 5 mm or more and 2,000 mm or less, and a height thereof is 1 or more and 100 or less when the equivalent circle diameter is assumed to be 1; and (iv) a shape thereof is a multiangular plate (or polygonal shape), an equivalent circle diameter of a cross section thereof is 5 mm or more and 500 mm or less, a thickness thereof is 5 mm or more and less than 500 mm, and a thickness thereof is 0.01 or more and less than 1 when the equivalent circle diameter is assumed to be 1.

(4) A method for producing an sintered α alumina sintered body for the production of a sapphire single crystal, comprising the steps of:

Step (a): mixing 100 parts by weight of an α alumina with 1 part by weight or more and 20 parts by weight or less of an α alumina precursor to obtain a mixture;

Step (b): forming a compact from the mixture; and

Step (c): firing the compact to obtain an α alumina sintered body.

(5) The method according to said (4), wherein the α alumina has a specific surface area of 1 m$^2$/g or more and 20 m$^2$/g or less, a moisture content of less than 0.5%, a purity of 99.99% by mass or more, and each content of Si, Na, Ca, Fe, Cu and Mg of 10 ppm or less.

(6) The method according to the said (4) or (5), wherein the α alumina precursor has a specific surface area of 50 m$^2$/g or more, a moisture content of 0.5% or more, a purity of 99.99% by mass or more, and each content of Si, Na, Ca, Fe, Cu and Mg of 10 ppm or less.

(7) The method according to any one of said (4) to (6), wherein the α alumina precursor is at least one selected from the group consisting of aluminum hydroxide and transition alumina.

(8) The method according to any one of the said (4) to (7), wherein the compact is formed under the conditions that a pressure is 20 MPa or more and 400 MPa or less and a method of the forming is any one of press forming and cold isostatic pressing.

(9) The method according to any one of said (4) to (8), wherein firing is carried out under the conditions that a temperature is 1,200° C. or higher and 1,700° C. or lower, a retention time is 0.5 hour or more and within 24 hours, and a temperature rise rate (i.e. heating rate) is 30° C./hour or more and 500° C./hour or less.

The α alumina sintered body for the production of a sapphire single crystal of the present invention is capable of easily obtaining a high quality sapphire single crystal with less coloration and cracking by a method of heating the α alumina sintered body to melt in a crucible, and pulling up the melt. Furthermore, a sapphire single crystal can be produced with high volume efficiency, for example, by forming an α alumina sintered body for the production of a sapphire single crystal into a disk and stacking (or laminating) a plurality of the disks, or forming the α alumina sintered body into a column, and bundling a plurality of the columns, and then charging in a crucible.

The compact according to the present invention has a high mechanical strength and is therefore suitably used as a raw material for the production of an α alumina sintered body for the production of a sapphire single crystal.

BRIEF DESCRIPTION OF THE DRAWINGS

FIG. 1(a) is a perspective view showing a disk-shaped a alumina sintered body for the production of a sapphire single crystal according to an embodiment of the present invention; FIG. 1(b) is perspective view showing an α alumina sintered body for the production of a plurality of sapphire single crystal divided from the α alumina sintered body according to FIG. 1(a); FIG. 1(c) is a perspective view showing a column-shaped α alumina sintered body for the production of a sapphire single crystal according to another embodiment of the present invention; FIG. 1(d) is a perspective view showing a prism-shaped α alumina sintered body for the production of a sapphire single crystal according to still another embodiment of the present invention; and FIG. 1 (e) is a perspective view showing a multiangular plate-shaped a alumina sintered body for the production of a sapphire single crystal according to still yet another embodiment of the present invention.

DETAILED DESCRIPTION OF THE INVENTION

α Alumina Sintered Body for Production of Sapphire Single Crystal

The α alumina sintered body of the present invention for the production of a sapphire single crystal (hereinafter sometimes simply referred to as an α alumina sintered body) has a predetermined relative density, closed porosity, purity, each content of Si, Na, Ca, Fe, Cu and Mg, and volume.

The α alumina sintered body may have a relative density of 60% or more, and preferably 65% or more and 95% or less. When the relative density of is within the above range, high volume efficiency is exhibited in the production of a sapphire single crystal. The relative density is a value in which a density of a sintered body is divided by an α alumina theoretical sintering density and then multiplied by 100.

The α alumina sintered body has a closed porosity of 10% or less, preferably 8% or less, and more preferably 0% or more and 4% or less. When the closed porosity of is within the above range, less moisture is incorporated into closed pores in the production process of a sapphire single crystal and, when the α alumina sintered body is heated to melt, a crucible is not likely to be oxidized due to moisture and also the number of voids formed in the sapphire single crystal decreases. Closed porosity means the proportion of a volume of closed pores among the total volume of a volume of the α alumina sintered body itself, a volume of closed pores and a volume of opened pores.

The relative density and closed porosity can be measured, for example, by the evaluation method described in Examples.

The α alumina sintered body has a purity of 99.99% by mass or more. When the purity is within the above range, it is possible to obtain a high quality sapphire single crystal with less coloration, cracking, bubbles and the like.

Each content of Si, Na, Ca, Fe, Cu and Mg in the α alumina sintered body is 10 ppm or less. Preferably, the content of Si is 8 ppm or less, the content of Na is 5 ppm or less, the content of Ca is 1 ppm or less, the content of Fe is 8 ppm or less, the content of Cu is 1 ppm or less and the content of Mg is 1 ppm or less. Ideally, these elements are not preferably contained. When each content is within the above range, a high quality sapphire single crystal with less coloration, cracking, bubbles and the like can be obtained.

The α alumina sintered body has a volume of 1 $cm^3$ or more, and preferably 5 $cm^3$ or more. The upper limit of the volume of the α alumina sintered body is limited to a crucible for the production of a sapphire single crystal. Usually, the upper limited of the volume is 200,000 $cm^3$ or less.

Usually, the shape of the α alumina sintered body is preferably any one of a disk, a column, a prism and a multiangular plate. If the α alumina sintered body has any one of the above shapes, a sapphire single crystal can be produced with high volume efficiency, for example, by forming an α alumina sintered body for the production of a sapphire single crystal into any shape described above, followed by stacking or bundling, and further charging in a crucible.

FIG. 1(a) is a perspective view showing a disk-shaped a alumina sintered body 1 for the production of a sapphire single crystal according to an embodiment of the present invention; and FIG. 1(b) is perspective view showing an α alumina sintered body 2 for the production of a plurality of sapphire single crystal divided from the α alumina sintered body according to FIG. 1(a).

As shown in FIG. 1(a), regarding the size of the α alumina sintered body 1 having a disk shape, it is preferred that a diameter of a cross section is 5 mm or more and 500 mm or less, a thickness is 5 mm or more and less than 500 mm, and a thickness is 0.01 or more and less than 1 when a diameter is assumed to be 1. Examples of the α alumina sintered body 1, which satisfies these conditions, include a alumina sintered bodies 1a to 1h shown in Table 1.

TABLE 1

| No | Diameter (mm) | | Thickness (mm) | |
| --- | --- | --- | --- | --- |
| | Lower limit | Upper limit | Lower limit | Upper limit |
| 1a | 10 | 20 | 5 | 10 |
| 1b | 20 | 40 | 5 | 20 |
| 1c | 50 | 80 | 5 | 50 |
| 1d | 100 | 150 | 10 | 100 |
| 1e | 150 | 200 | 15 | 150 |
| 1f | 200 | 250 | 20 | 200 |
| 1g | 250 | 300 | 25 | 250 |
| 1h | 300 | 460 | 30 | 300 |

As shown in FIG. 1(b), the α alumina sintered body 1 may be divided into a plurality of α alumina sintered bodies 2. Division in such a manner makes it easy to handle in case of charging the α alumina sintered body in a crucible.

Regarding the α alumina sintered body 1 having a shape shown in FIG. 1(b), as described above, a compact having a form (a shape of a part of a disk) shown in FIG. 1(b) may be formed in advance and then fired to obtain an α alumina sintered body 2, in place of division to obtain a compact after forming the α alumina sintered body 1 shown in FIG. 1(a).

As used herein, the term "disk" is the concept including a shape corresponding to a part of a complete disk, like the α alumina sintered body 2.

FIG. 1(c) is a perspective view showing a column-shaped α alumina sintered body 3 for the production of a sapphire single crystal according to another embodiment of the present invention.

As shown in FIG. 1(c), regarding the size of the α alumina sintered body 3 having a column shape, it is preferred that a diameter of a cross section is 5 mm or more and 500 mm or less, a height is 5 mm or more and 2,000 mm or less, and a height is 1 or more and 100 or less when a diameter is assumed to be 1. Examples of the α alumina sintered body 3, which satisfies these conditions, include α alumina sintered bodies 3a to 3h shown in Table 2.

TABLE 2

| No | Diameter (mm) | | Height (mm) | |
| --- | --- | --- | --- | --- |
| | Lower limit | Upper limit | Lower limit | Upper limit |
| 3a | 5 | 20 | 20 | 1500 |
| 3b | 20 | 40 | 40 | 1500 |
| 3c | 50 | 80 | 80 | 1500 |
| 3d | 100 | 150 | 150 | 1500 |
| 3e | 150 | 200 | 200 | 1500 |
| 3f | 200 | 250 | 250 | 1500 |
| 3g | 250 | 300 | 300 | 1500 |
| 3h | 300 | 460 | 460 | 1500 |

FIG. 1(d) is a perspective view showing a prism-shaped α alumina sintered body 4 for the production of a sapphire single crystal according to still another embodiment of the present invention.

As shown in FIG. 1(d), regarding the size of the α alumina sintered body 4 having a prism shape, it is preferred that a cross section is 5 mm or more and 500 mm or less, a height is 5 mm or more and 2,000 mm or less, and a height is 1 or more and 100 or less when an equivalent circle diameter is assumed to be 1. Examples of the α alumina sintered body 4, which satisfies these conditions, include α alumina sintered bodies 4a to 4h shown in Table 3.

Herein, the equivalent circle diameter of a cross section means a diameter of a circle having the same area as a cross-sectional area (the same shall apply hereinafter).

TABLE 3

| No | Equivalent circle diameter (mm) | | Height (mm) | |
|---|---|---|---|---|
| | Lower limit | Upper limit | Lower limit | Upper limit |
| 4a | 10 | 20 | 20 | 1500 |
| 4b | 20 | 40 | 40 | 1500 |
| 4c | 50 | 80 | 80 | 1500 |
| 4d | 100 | 150 | 150 | 1500 |
| 4e | 150 | 200 | 200 | 1500 |
| 4f | 200 | 250 | 250 | 1500 |
| 4g | 250 | 300 | 300 | 1500 |
| 4h | 300 | 460 | 460 | 1500 |

FIG. 1 (e) is a perspective view showing a multiangular plate-shaped α alumina sintered body 5 for the production of a sapphire single crystal according to yet another embodiment of the present invention.

As shown in FIG. 1(e), regarding the size of the α alumina sintered body 5 having a multiangular plate shape, it is preferred that an equivalent circle diameter of a cross section is 5 mm or more and 500 mm or less, a thickness is 5 mm or more and less than 500 mm, and a thickness is 0.01 or more and less than 1 when the equivalent circle diameter is assumed to be 1. Examples of the α alumina sintered body 5, which satisfies these conditions, include α alumina sintered bodies 5a to 5h shown in Table 4.

As used herein, the term "cross section" of a sintered body means a plane which appears when cutting by a plane vertical to a height or thickness direction of a shape of a sintered body. In the sintered bodies each having a shape shown in FIG. 1(a) to FIG. 1(e), it means a plane which appears when cutting by a plane vertical to a thickness or height direction of a sintered body, that is, a plane vertical to a z-axis (xy-plane).

TABLE 4

| No | Equivalent circle diameter (mm) | | Thickness (mm) | |
|---|---|---|---|---|
| | Lower limit | Upper limit | Lower limit | Upper limit |
| 5a | 10 | 20 | 5 | 10 |
| 5b | 20 | 40 | 5 | 20 |
| 5c | 50 | 80 | 5 | 50 |
| 5d | 100 | 150 | 10 | 100 |
| 5e | 150 | 200 | 15 | 150 |
| 5f | 200 | 250 | 20 | 200 |
| 5g | 250 | 300 | 25 | 250 |
| 5h | 300 | 460 | 30 | 300 |

It is possible to produce a sapphire single crystal easily by heating to melt an α alumina sintered body for the production of a sapphire single crystal, followed by cooling.

It is also possible to obtain a high quality sapphire single crystal with less coloration and cracking by using an α alumina sintered body for the production of a sapphire single crystal as an alumina raw material for the production of a sapphire single crystal.

It is possible to produce a sapphire single crystal with high volume efficiency and high heat transfer efficiency by forming into a disk and stacking (or laminating) a plurality of the disks, or forming into a rod, and bundling a plurality of rods, and then charging in a crucible.

The α alumina for the production of a single crystal can be used as a raw material of sapphire single crystal growing methods such as an EFG method, a Czochralski method and a Kyropoulos method, and is preferably used in a Czochralski method or Kyropoulos method that requires filling of the raw material in a crucible with high volume efficiency.

[Method for Producing α Alumina for Production of Sapphire Single Crystal]

The α alumina sintered body of the present invention can be produced, for example, by the method including the steps (a), (b) and (c):

Step (a) of mixing an α alumina (hereinafter may sometimes referred to as an α alumina powder) with an α alumina precursor in a predetermined ratio to obtain a mixture, Step (b) of forming a compact from the mixture, and Step (c) of firing the compact to obtain an α alumina sintered body.

It is possible to impart sufficient mechanical strength, which enables prevention of breakage, during introduction into a firing furnace and firing in a firing furnace by mixing an α alumina powder with an α alumina precursor in the below-mentioned ratio.

(α Alumina Powder)

The α alumina powder is preferably an α alumina powder having a high purity, for example, a purity of 99.99% by weight or more, in which a moisture content is less than 0.5%, a BET specific surface area is preferably 1 $m^2$/g or more and 20 $m^2$/g or less, more preferably 1 $m^2$/g or more and 10 $m^2$/g or less, an average particle diameter is preferably 0.1 μm or more and 5.0 μm or less, and more preferably 0.1 μm or more and 1.0 μm or less, each content of Si, Na, Ca, Fe, Cu and Mg is preferably 10 ppm or less and, more preferably, the content of Si is 8 ppm or less, the content of Na is 5 ppm or less, the content of Ca is 1 ppm or less, the content of Fe is 8 ppm or less, the content of Cu is 1 ppm or less, and the content of Mg is 1 ppm or less and, ideally, these elements are preferably not contained. When the purity is within the above range, it is easy to obtain an α alumina sintered body for the production of a sapphire single crystal, which has a purity defined in the present invention. When the moisture content is out of the above range, it becomes difficult to obtain an α alumina sintered body having the above-mentioned relative density. When the BET specific surface area is out of the above range, it becomes difficult to obtain an α alumina sintered body having the above-mentioned relative density. When the average particle diameter is less than 0.1 μm, a further improvement in the relative density of the obtained α alumina sintered body for the production of a sapphire single crystal is not recognized and energy is required for the preparation of an α alumina powder (grinding step, etc.). When the average particle diameter is more than 5.0 μm, it is not easy to obtain an α alumina sintered body for the production of a sapphire single crystal, which has a relative density defined in the present invention. When each content of Si, Na, Ca, Fe, Cu and Mg is within the above range, it is possible to obtain an α alumina sintered body in which the content is as described above.

The purity, moisture content, BET specific surface area and average particle diameter can be measured, for example, by evaluation methods described in Examples.

Examples of the method for producing an α alumina powder include a method in which aluminum hydroxide produced by an aluminum alkoxide method is fired; a method in which synthesis is carried out using an organoaluminum; a method in which a transition alumina or an alumina powder, which is converted into a transition alumina by a heat treatment, as the raw material is fired in an atmosphere gas containing hydrogen chloride; methods described in JP 2010-150090A, JP 2008-100903A, JP 2002-0470A09, JP 2001-354413A and the like.

JP 2010-150090A, JP 2008-100903A, JP 2002-047009A, JP 2001-354413A are incorporated by reference herein.

Examples of the aluminum alkoxide method include a method in which an aluminum alkoxide is hydrolyzed to obtain a slurry-, sol- or gel-like aluminum hydroxide, and then the obtained aluminum hydroxide is dried to obtain a dry-powdered aluminum hydroxide.

The objective α alumina powder can be obtained by firing the dry-powdered aluminum hydroxide obtained by the aluminum alkoxide method.

The aluminum hydroxide is usually fired by a method in which the aluminum hydroxide is filled in a firing container.

Examples of the firing container include a sheath or the like.

The material of the firing container is preferably alumina, and particularly preferably a high purity α alumina, from the viewpoint of prevention of contamination of the obtained α alumina powder.

Examples of the firing furnace used in firing of aluminum hydroxide include material stationary type firing furnaces such as a tunnel kiln, a batch-wise airflow box type firing furnace and a batch-wise parallel current flow box type firing furnace; a rotary kiln and the like.

The firing temperature, temperature rise rate until reaching firing temperature, and firing time of aluminum hydroxide are appropriately selected so as to obtain an α alumina having the above-mentioned objective physical properties.

The firing temperature of aluminum hydroxide is 1,100° C. or higher and 1,450° C. or lower, and preferably 1,200° C. or higher and 1,350° C. or lower. The temperature rise rate until reaching this firing temperature is usually 30° C./hour or more and 500° C./hour or less. The firing time of aluminum hydroxide is usually 0.5 hour or more and within 24 hours, and preferably 1 hour or more and within 10 hours.

Aluminum hydroxide may be fired, for example, in an atmosphere of an inert gas such as a nitrogen gas or an argon gas, as well as in an air atmosphere, and may be fired in an atmosphere having a high partial water vapor pressure, like an atmosphere generated in a gas furnace which enables firing by combustion of a propane gas.

The obtained α alumina powder sometimes aggregates in a state where an average particle diameter is more than 10 μm. In that case, grinding is preferably carried out.

The α alumina powder can be ground, for example, by using a known apparatus such as a vibrating mill, a ball mill or a jet mill, and it is possible to employ any of a method of grinding in a dry state and a method of grinding in a wet state. In order to achieve physical properties of the above-mentioned α alumina powder without including coarse aggregate particles while maintaining the purity, a method of grinding using jet mill is exemplified as a preferable method of grinding while maintaining the purity.

The average particle diameter of the α alumina powder can be measured, for example, by the evaluation method described in Examples.

The grinding apparatus is preferably a grinding apparatus in which the plane in contact with an α alumina is constituted with a high purity α alumina material or a resin lining from the viewpoint of less contamination of the obtained α alumina powder.

In case of grinding using a medium stirring mill, a grinding medium used therefor is preferably constituted from a high purity α alumina material.

(α Alumina Precursor Substance)

The α alumina precursor is a compound capable of converting into an α alumina by firing, and examples thereof include powders made of aluminum hydroxide, transition alumina or the like. The α alumina precursor is preferably at least one selected from the group consisting of aluminum hydroxide and transition alumina.

Examples of the aluminum hydroxide include crystalline aluminum hydroxides such as gibbsite, boehmite, pseudo-boehmite, bayerite, norstrandite and diaspore type aluminum hydroxide; and amorphous aluminum hydroxide.

Examples of the transition alumina include γ alumina, χ alumina, θ alumina, ρ alumina and κ alumina, crystal phase of each of which is a γ phase, χ phase, θ phase, ρ phase and κ phase, respectively.

A description is made by way of the case of using, as an α alumina precursor, a γ alumina (gamma alumina) powder as an example.

The γ alumina powder is a γ alumina powder having a high purity, for example, a purity of 99.99% by weight or more, in which a moisture content is 0.5% or more, and preferably 1% or more and 4% or less, a BET specific surface area is 50 m$^2$/g or more, and preferably 100 m$^2$/g or more and 250 m$^2$/g or less, an average particle diameter is preferably 0.1 μm or more and 10.0 μm or less, and more preferably 0.1 μm or more and 5.0 μm or less, each content of Si, Na, Ca, Fe, Cu and Mg is 10 ppm or less and, preferably, the content of Si is 8 ppm or less, the content of Na is 5 ppm or less, the content of Ca is 1 ppm or less, the content of Fe is 8 ppm or less, the content of Cu is 1 ppm or less, and the content of Mg is 1 ppm or less and, ideally, these elements are not preferably contained. When purity is within the above range, it is easy to obtain an α alumina sintered body for the production of a sapphire single crystal, which has a purity defined in the present invention. When the moisture content is out of the above range, it becomes difficult to obtain an α alumina sintered body having the above-mentioned relative density. When the BET specific surface area is out of the above range, it becomes difficult to obtain an α alumina sintered body having the above-mentioned relative density. When the average particle diameter is less than 0.1 μm, it is difficult to industrially produce a γ alumina powder. When the average particle diameter is more than 10.0 μm, it is difficult to obtain an α alumina sintered body for the production of a sapphire single crystal, which has the above-mentioned relative density. When each content of Si, Na, Ca, Fe, Cu and Mg is within the above range, it is possible to obtain an α alumina sintered body in which the content is as described above.

The purity, moisture content, BET specific surface area and average particle diameter can be measured in the same manner as in the above-mentioned method of measuring physical properties of an α alumina powder.

The γ alumina powder can be produced, for example, by an aluminum alkoxide method, and the objective γ alumina powder can be obtained by firing the dry-powdered aluminum hydroxide obtained by the above-mentioned production process of an α alumina powder.

The aluminum hydroxide for the production of γ alumina powder (hereinafter referred to as aluminum hydroxide (A)) is usually fired by a method in which the aluminum hydroxide (A) is filled in a firing container.

Examples of the firing container include a sheath or the like.

The material of the firing container is preferably alumina, and particularly preferably a high purity α alumina, from the viewpoint of prevention of contamination of the obtained γ alumina powder.

Examples of the firing furnace used in firing of aluminum hydroxide (A) include material stationary type firing furnaces such as a tunnel kiln, a batch-wise airflow box type firing furnace and a batch-wise parallel current flow box type firing furnace; a rotary kiln and the like.

The firing temperature, temperature rise rate until reaching firing temperature, and firing time of aluminum hydroxide (A) are appropriately selected so as to obtain a γ alumina having the above-mentioned objective physical properties.

The firing temperature of aluminum hydroxide (A) is 600° C. or higher and 1,000° C. or lower, and preferably 700° C. or higher and 900° C. or lower. The temperature rise rate until reaching this firing temperature is usually 30° C./hour or more and 500° C./hour or less. The firing time of aluminum hydroxide (A) is usually 0.5 hour or more and within 24 hours, and preferably 1 hour or more and within 10 hours.

Aluminum hydroxide (A) may be fired, for example, in an atmosphere of an inert gas such as a nitrogen gas or an argon gas, as well as in an air atmosphere, and may be fired in an atmosphere having a high partial water vapor pressure, like an atmosphere generated in a gas furnace which enables firing by combustion of a propane gas.

The obtained γ alumina powder sometimes aggregates in a state where an average particle diameter is more than 10 μm. In that case, grinding is preferably carried out.

The γ alumina powder can be ground, for example, by using a known apparatus such as a vibrating mill, a ball mill or a jet mill, and it is possible to employ any of a method of grinding in a dry state and a method of grinding in a wet state. In order to achieve physical properties of the above-mentioned γ alumina powder without including coarse aggregate particles while maintaining the purity, a method of grinding using jet mill is exemplified as a preferable method of grinding while maintaining the purity.

The grinding apparatus is preferably a grinding apparatus in which the plane in contact with a γ alumina is constituted with a high purity α alumina material or a resin lining from the viewpoint of less contamination of the obtained γ alumina powder. In case of grinding using a medium stirring mill, a grinding medium used therefor is preferably constituted from a high purity α alumina material.

Also in case of using, as the α alumina precursor, a transition alumina other than the γ alumina powder (for example, δ alumina, θ alumina), a transition alumina can be prepared by appropriately adjusting the firing temperature, temperature rise rate until reaching the firing temperature, and firing time and firing atmosphere.

(Mixture)

100 parts by weight of an α alumina powder is mixed with 1 part by weight or more and 20 parts by weight or less, preferably 1 part by weight or more and 10 parts by weight or less, and more preferably 1 part by weight or more and 5 parts by weight or less, of a γ alumina powder. When the amount of the γ alumina powder is less than 1 part by weight, the strength of the compact obtained by compacting the mixture becomes insufficient, and the shape of the compact is easily collapsed by contact, impact or the like, and thus an α alumina sintered body having the volume defined in the present invention may not be obtained. In contrast, when the amount of the γ alumina powder is more than 20 parts by weight, an α alumina sintered body having the volume defined in the present invention may not be obtained.

The method of mixing an α alumina powder with a γ alumina powder may be, for example, a method of dry-mixing in a dry state without adding a solvent such as water, or a method of wet-mixing in a wet state by adding a solvent such as water.

In case of mixing by dry mixing, for example, it is possible to employ a method in which a drum mixer, a V-shaped mixer, a vibrating stirrer, a planetary mill, a ball mill or the like is used.

In case of mixing by wet mixing, for example, it is possible to use a ball mill or mixer, a method of irradiating with ultrasonic wave or the like. From the viewpoint of less contamination with impurities, the method of irradiating with ultrasonic wave is preferable.

Water is usually used as the solvent used in wet mixing. In order to improve dispersibility of an α alumina powder and a γ alumina powder, a dispersing agent may be added.

From the purpose of maintaining a high purity alumina, the dispersing agent to be added is preferably, for example, a polymeric dispersing agent such as a polyacrylic acid ammonium salt so that it is vaporized during firing of the compact and does not remain in an α alumina sintered body as impurities.

In case of wet mixing, the obtained slurry is usually dried. For example, drying may be carried out by stationary drying, fluidized-bed drying or the like, or drying may be carried out by spray drying in a granular form.

For example, spray drying is carried out by spraying a mixed slurry of an α alumina powder and a γ alumina powder through a nozzle to form droplets, and drying in a gas flow, whereby, moisture in the sprayed slurry in the form of droplets to obtain mixed granules of the α alumina and the γ alumina.

The particle diameter of the mixed granules is usually about 20 μm or more and about 200 μm or less. The particle diameter can be controlled, for example, by the diameter of droplets in case of being sprayed through the nozzle, moisture content in the slurry or the like.

(Compact)

A compact can be obtained, for example, by pressure forming such as press forming, compression forming, cold isostatic pressing (CIP) or hot isostatic pressing (HIP) of the mixture obtained described above.

The forming pressure in case of forming (or compacting) is usually 20 MPa or more and 400 MPa or less, and preferably 50 MPa or more and 200 MPa or less, from the viewpoint of easily obtaining a compact having a predetermined mechanical strength. When the forming pressure is less than 20 MPa, the obtained compact has a low mechanical strength and thus the compact is likely to be broken during introduction into a firing furnace or firing in a firing furnace, unfavorably. The forming pressure of more than 400 MPa is not preferable since it is difficult to industrially achieve.

The obtained compact usually has any one of shapes such as disk, column, multiangular plate and prism. The compact may be cut into a shape and size which are close to those of a crucible used to pull up a sapphire single crystal.

The mold used in forming is preferably a mold in which the plane in contact with a mixture is made of a high purity α alumina material or a rubber, or the plane is lined with a resin, from the viewpoint of less contamination of the obtained compact.

(Sintered Body)

A sintered body is obtained by firing the compact thus obtained above.

The firing temperature of the compact is usually 1,200° C. or higher and 1,700° C. or lower, and preferably 1,300° C. or higher and 1,600° C. or lower, from the viewpoint of easily obtaining an α alumina sintered body having the purity, closed porosity and relative density defined in the present invention. When the firing temperature is higher than 1,700° C., sintering of the compact excessively proceeds and thus α alumina sintered body having the closed porosity defined in the present invention may not be obtained, and contamination with impurities from a firing furnace is likely to occur. When the firing temperature is lower than 1,200° C., the γ alumina powder is not sufficiently converted into an α alumina powder and/or the strength of an obtained α alumina sintered body becomes insufficient. Therefore the shape of the α alumina sintered body is easily collapsed by contact, impact or the like, and thus an α alumina sintered body having the volume defined in the present invention may not be obtained.

The temperature rise rate until reaching the firing temperature of the compact may be, for example, 30° C./hour or more and 500° C./hour or less. Even if the temperature rise rate is less than 30° C./hour, the relative density of the obtained α alumina sintered body does not vary and firing requires much energy, unfavorably. When the temperature rise rate is more than 500° C./hour, breakage and cracking of the α alumina sintered body are likely to occur and thus it may become difficult to obtain an α alumina sintered body having the above volume.

The firing time (retention time of firing temperature) of the compact may be the time enough to convert the γ alumina into an α alumina, and varies depending on the ratio of the amount of the α alumina to that of the γ alumina, type of a firing furnace, firing temperature, fire atmosphere and so on. For example, the firing time is 30 minutes or more and within 24 hours, and preferably 1 hour or more and within 10 hours.

The compact may be fired in an air atmosphere, or an atmosphere of an inert gas such as a nitrogen gas or an argon gas. The compact may also be fired in a wet atmosphere having a high partial water vapor pressure.

The compact may be fired, for example, using conventional firing furnaces such as a tubular electric furnace, a box-type electric furnace, a tunnel furnace, a far-infrared furnace, a microwave heating furnace, a shaft furnace, a reflection furnace, a rotary hearth furnace and a roller hearth furnace. Firing can be carried out in either a batch-wise or continuous manner. Firing may be carried out in a batch-wise or continuous manner.

The compact is usually fired by filling the compact in a firing container.

Examples of the firing container include a sheath or the like. The firing container is preferably made of alumina, and particularly preferably made of α alumina, from the viewpoint of prevention of contamination

EXAMPLES

The present invention will be described in more detail by way of Examples, but the present invention is not limited to these Examples.

The evaluation methods are as follows.
(1) Relative Density

After measuring a sintered density by the Archimedian method, a relative density was calculated by the following equation.

Relative density(%)=sintered density [g/cm$^3$]/3.98[g/cm$^3$; α alumina theoretical sintered density]×100.

(2) Closed Porosity

A closed porosity was calculated from a particle density and a pore volume (volume of open pores) by the following equation. The pore volume was determined by the following procedure. That is, after drying a sample at 120° C. for 4 hours, the pore volume was determined as a pore volume in a pore diameter range of 1 μm or less by a mercury penetration method. The particle density was calculated based on the method of measuring a true specific gravity defined in JIS R 7222 (1997).

Volume of closed pores(cm$^3$/g)=(1/particle density)−(1/3.98)

Closed porosity(%)=[(volume of closed pores)/{(1/3.98)+pore volume+volume of closed pores}]×100

(3) Volume

A volume was calculated by applying a sintered density of an α alumina sintered body for the production of a single crystal sapphire measured by the Archimedian method and a weight per one piece of the sintered body to the equation.

Volume(cm$^3$/piece)=weight [g/piece]/sintered density [g/cm$^3$].

(4) Concentration of Impurities and Purity

Each content of Si, Na, Mg, Cu, Fe and Ca was measured by optical emission spectrometry. A purity was determined by calculating the sum total (%) of the weight of $SiO_2$, $Na_2O$, MgO, CuO, $Fe_2O_3$ and CaO contained in an α alumina for the production of a sapphire single crystal, and subtracting the obtained sum total from 100. A calculation equation is as follows.

Purity(%)=100(%)−sum total(%) of impurities (5) Average Particle Diameter

An average particle diameter of an α alumina powder and a γ alumina powder was determined by the following procedure. Using a laser particle size distribution analyzer ["Microtrac", manufactured by Nikkiso Co., Ltd.], a cumulative percentage 50% equivalent particle diameter on mass basis was measured as an average particle diameter by a laser diffraction method.

(6) Specific Surface Area

A specific surface area was measured by a nitrogen absorption method using a BET specific surface area analyzer ["2300-PC-1A" manufactured by Shimadzu Corporation].

(7) Moisture Content

The amount of moisture absorbed on an α alumina powder was determined by drying a sample at 110° C. based on JIS H 1901 (1997) and then measuring as the weight loss.

(8) Compact Relative Strength

A compact relative strength was determined by the following procedure. In accordance with a method for a room temperature bending strength test defined in JIS R1601, a three-point bending strength was measured and then the compact relative strength was calculated as relative bending strength when a bending strength of a compact made of α alumina powder "AKP-3000" (manufactured by Sumitomo Chemical Company, Limited) is assumed to be 100.

(9) Untamped Density

An untamped density was determined by filling a sample in a cylinder having a volume of 200 cm$^3$ and a ratio of a depth to an inner diameter of 6:1, and then calculating by dividing the weight of the sample by the volume of the measuring container (cylinder).

Example 1

Production of α Alumina Powder

Aluminum isopropoxide was hydrolyzed by water to obtain a slurry-like aluminum hydroxide, and then drying the slurry-like aluminum hydroxide to obtain a dry-powdered aluminum hydroxide having an untamped density of 0.1 g/cm³.

Furthermore, this aluminum hydroxide was fired while maintaining at 1,220° C. for 4 hours, and then ground using a jet mill to obtain an α alumina powder.

The obtained α alumina powder had a BET specific surface area of 4.5 m²/g, a moisture content of 0.2%, an average particle diameter of 0.52 μm, a Si content of 4 ppm, a Fe content of 4 ppm, a Cu content of 1 ppm, a Na content of 2 ppm, a Mg content of 1 ppm, and an alumina purity of 99.99% by weight or more.

Production of γ Alumina Powder

Aluminum isopropoxide was hydrolyzed by water to obtain a slurry-like aluminum hydroxide, and then drying the slurry-like aluminum hydroxide to obtain a dry-powdered aluminum hydroxide having an untamped density of 0.1 g/cm³.

Furthermore, this aluminum hydroxide was fired while maintaining at 800° C. for 3 hours, and then ground using a jet mill to obtain a γ alumina powder.

The obtained γ alumina powder had a BET specific surface area of 154.2 m²/g, a moisture content of 2%, an average particle diameter of 2.4 μm, a Si content of 2 ppm, a Fe content of 4 ppm, a Cu content of 1 ppm, a Na content of 2 ppm, a Mg content of 1 ppm, and an alumina purity of 99.99% by weight or more.

Production of Sintered Body

An α alumina powder was mixed with a γ alumina powder in a bag made of a resin for 10 minutes to obtain a mixture. The amount of the γ alumina powder mixed was 2 parts by weight based on 100 parts by weight of an α alumina sintered body to be obtained.

The mixture was charged in a cylindrical mold having an inner diameter of 30 mm made of a rubber and then compacted using an isostatic press at 1 t/cm² (98 MPa) to obtain a compact.

This compact has a sufficient mechanical strength without being broken during introduction into a firing furnace and firing in a firing furnace in the production of an α alumina sintered body for the production of a sapphire single crystal.

The obtained compact was heated to 1,350° C. at a temperature rise rate of 100° C./hour and then fired while maintaining at a firing temperature of 1,350° C. for 4 hours to obtain an α alumina sintered body.

The α alumina sintered body had a relative density of 69%, a closed porosity of 0%, a shape of a column, a volume of 6 cm³, a Si content of 6 ppm, a Na content of 5 ppm or less, a Mg content of 1 ppm or less, a Cu content of 1 ppm or less, a Fe content of 4 ppm, a Ca content of 1 ppm or less, and an alumina purity of 99.99%.

A lot of these α alumina sintered bodies are arranged and filled in a crucible, whereby, high volume efficiency is exhibited in the production of a sapphire single crystal.

Example 2

In the same manner as in Example 1, a mixture of an α alumina powder and a γ alumina powder was obtained.

In the same manner as in Example 1, except that the mixture was charged in a mold having an inside dimension of 5 mm in diameter, 50 mm in a height and 50 mm in length, the mixture was formed into a prism to obtain a compact. The compact had a relative strength of 142 and an excellent mechanical strength.

This compact has a sufficient mechanical strength without being broken during introduction into a firing furnace and firing in a firing furnace in the production of an α alumina sintered body for the production of a sapphire single crystal.

In the same manner as in Example 1, an α alumina sintered body is obtained from the obtained compact.

A lot of these α alumina sintered bodies are arranged and filled in a crucible, whereby, high volume efficiency is exhibited in the production of a sapphire single crystal.

Example 3

In the same manner as in Example 2, except that the amount of the γ alumina powder was changed to 5 parts by weight based on 100 parts by weight of the α alumina sintered body to be obtained, a prism-shaped compact was obtained. The compact had a relative strength of 215 and an excellent strength.

This compact has a sufficient mechanical strength without being broken during introduction into a firing furnace and firing in a firing furnace in the production of an α alumina sintered body for the production of a sapphire single crystal.

In the same manner as in Example 1, the obtained compact is fired to obtain an α alumina sintered body.

When a lot of α alumina sintered bodies are arranged and filled in a crucible, high volume efficiency is exhibited in the production of a sapphire single crystal.

This application claims priority based on Japanese Patent Application No. 2011-000128. The disclosure of Japanese Patent Application No. 2011-000128 is incorporated by reference herein.

What is claimed is:

1. A method for producing an α alumina sintered body for the production of a sapphire single crystal, comprising the steps of:
   Step (a): mixing 100 parts by weight of an α alumina with 1 part by weight or more and 10 parts by weight or less of an α alumina precursor to obtain a mixture in a powder form or a granule form;
   Step (b): forming a compact from the mixture; and
   Step (c): firing the compact to obtain an α alumina sintered body.

2. The method according to claim 1, wherein the α alumina has a specific surface area of 1 m²/g or more and 20 m²/g or less, a moisture content of less than 0.5%, a purity of 99.99% by mass or more, and each content of Si, Na, Ca, Fe, Cu and Mg of 10 ppm or less.

3. The method according to claim 1 or 2, wherein the α alumina precursor has a specific surface area of 50 m²/g or more, a moisture content of 0.5% or more, a purity of 99.99% by mass or more, and each content of Si, Na, Ca, Fe, Cu and Mg is 10 ppm or less.

4. The method according to any one of claims 1 or 2, wherein the α alumina precursor is at least one selected from the group consisting of aluminum hydroxide and transition alumina.

5. The method according to any one of claims to 1 or 2, wherein the compact is formed under the conditions that a pressure is 20 MPa or more and 400 MPa or less and a method of the forming is any one of press forming and cold isostatic pressing.

6. The method according to any one of claims 1 or 2, wherein firing is carried out under the conditions that a temperature is 1,200° C. or higher and 1,700° C. or lower, a retention time is 0.5 hour or more and within 24 hours, and a temperature rise rate is 30° C./hour or more and 500° C./hour or less.

7. The method according to claim 3, wherein the α alumina precursor is at least one selected from the group consisting of aluminum hydroxide and transition alumina.

8. The method according to claim 3, wherein the compact is formed under the conditions that a pressure is 20 MPa or more and 400 MPa or less and a method of the forming is any one of press forming and cold isostatic pressing.

9. The method according to claim 4, wherein the compact is formed under the conditions that a pressure is 20 MPa or more and 400 MPa or less and a method of the forming is any one of press forming and cold isostatic pressing.

10. The method according to claim 3, wherein firing is carried out under the conditions that a temperature is 1,200° C. or higher and 1,700° C. or lower, a retention time is 0.5 hour or more and within 24 hours, and a temperature rise rate is 30° C./hour or more and 500° C./hour or less.

11. The method according to claim 4, wherein firing is carried out under the conditions that a temperature is 1,200° C. or higher and 1,700° C. or lower, a retention time is 0.5 hour or more and within 24 hours, and a temperature rise rate is 30° C./hour or more and 500° C./hour or less.

12. The method according to claim 5, wherein firing is carried out under the conditions that a temperature is 1,200° C. or higher and 1,700° C. or lower, a retention time is 0.5 hour or more and within 24 hours, and a temperature rise rate is 30° C./hour or more and 500° C./hour or less.

* * * * *